United States Patent [19]

Wanlass

[11] Patent Number: 5,216,299

[45] Date of Patent: Jun. 1, 1993

[54] LOW POWER NOISE REJECTING TTL TO CMOS INPUT BUFFER

[75] Inventor: Frank M. Wanlass, Sunnyvale, Calif.

[73] Assignee: Standard Microsystems Corporation, Hauppauge, N.Y.

[21] Appl. No.: 835,207

[22] Filed: Feb. 13, 1992

[51] Int. Cl.⁵ .................... H03K 17/16; H03K 19/094
[52] U.S. Cl. .................................. 307/475; 307/443; 307/451; 307/272.2
[58] Field of Search ............... 307/443, 451, 475, 264, 307/272.2

[56] References Cited

U.S. PATENT DOCUMENTS

| | | | |
|---|---|---|---|
| 4,471,242 | 9/1984 | Noufer et al. | 307/475 |
| 4,475,050 | 10/1984 | Noufer | 307/475 |
| 4,486,670 | 12/1984 | Chan et al. | 307/475 X |
| 4,532,436 | 7/1985 | Bismarck | 307/475 X |
| 4,786,830 | 11/1988 | Foss | 307/475 |
| 4,845,381 | 7/1989 | Cuevas | 307/475 X |
| 4,978,870 | 12/1990 | Chen et al. | 307/451 X |
| 4,980,583 | 12/1990 | Dietz | 307/475 |
| 5,159,206 | 10/1992 | Tsay et al. | 307/272.3 |

Primary Examiner—David R. Hudspeth
Attorney, Agent, or Firm—Thomas E. Schatzel

[57] ABSTRACT

A lower power, noise rejecting TTL-to-CMOS input buffer, without the use of a current consuming voltage reference, has the characteristic of recognizing a logic LOW as less than 0.8 volts and a logic HIGH as greater than 2.0 volts for DC TTL signals while drawing only leakage current from its Vcc power supply, and simultaneously possesses the characteristic of rejecting high-amplitude Vin noise. For an input signal rapidly rising from zero to three volts, the buffer output switches at an input signal level of approximately 2.5 volts; and for the input signal rapidly falling from 3 to zero volts, the buffer output switches at an input signal level of approximately 1.4 volts.

15 Claims, 4 Drawing Sheets

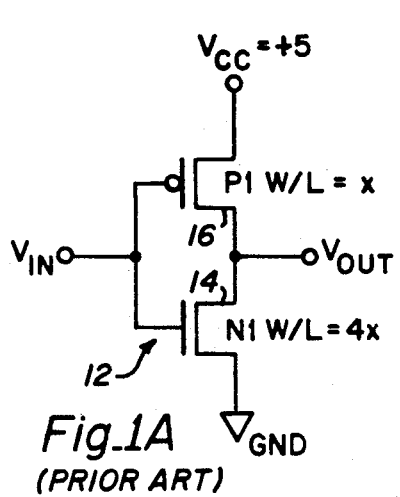
Fig_1A (PRIOR ART)
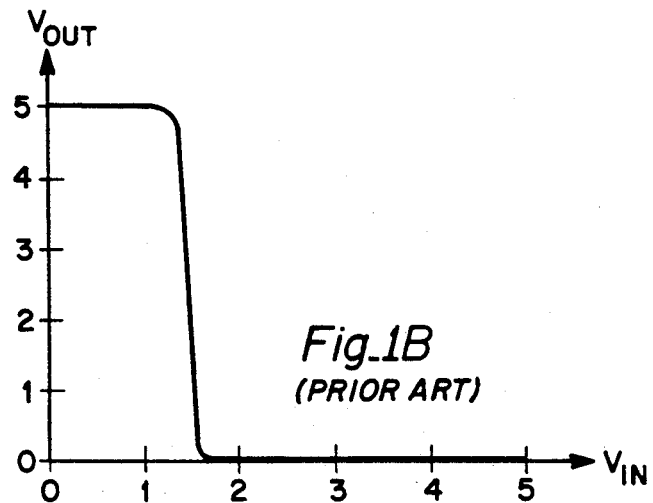
Fig_1B (PRIOR ART)
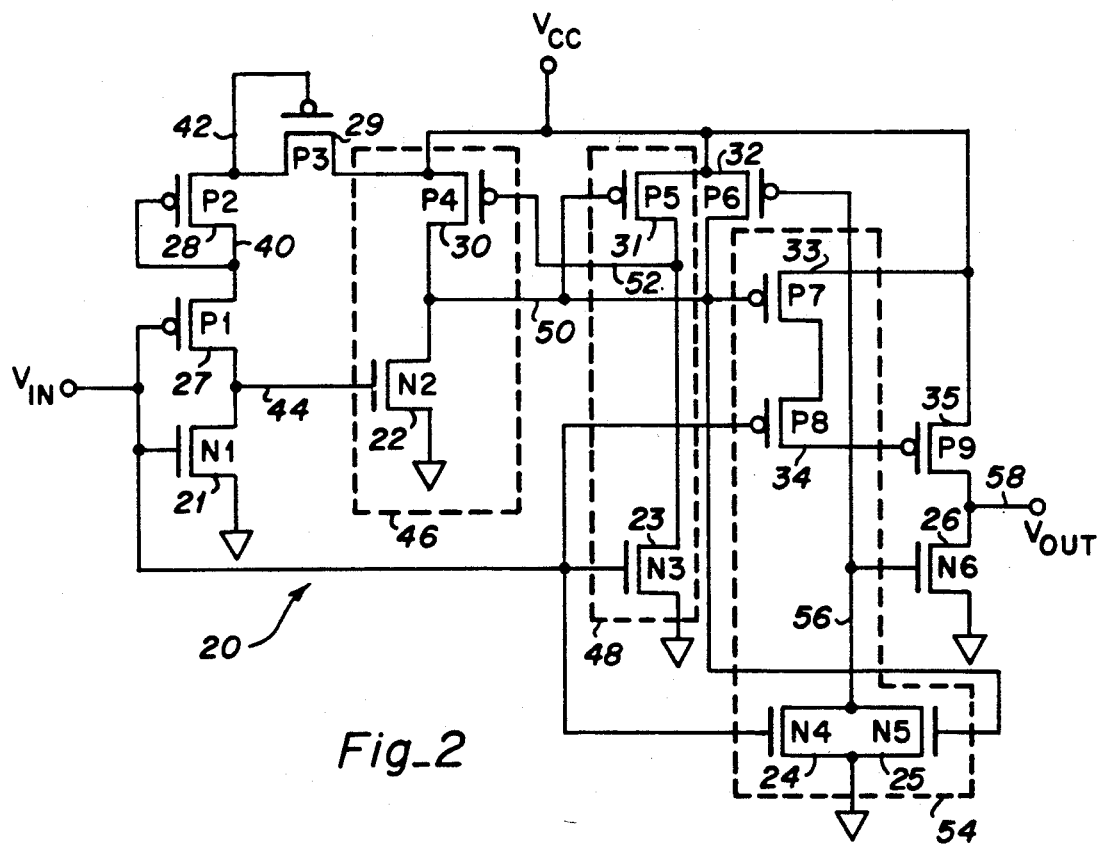
Fig_2

Fig_5

LOW POWER NOISE REJECTING TTL TO CMOS INPUT BUFFER

BACKGROUND OF THE PRESENT INVENTION

1. Field of the present invention

The present invention relates generally to TTL to CMOS input buffers, and more particularly to a buffer that maintains CMOS-type low quiescent current, even with typical TTL HIGH input levels, and yet is still able to reject high-frequency, high-amplitude noise.

2. Description of the Prior Art

Many electronic systems made today incorporate components that use more than one digital logic technology in their chips, microchips, integrated circuits (ICs), monolithic circuits, semiconductor devices, and microelectronic devices. For example, transistor-transistor logic (TTL) components and complementary metal oxide semiconductor (CMOS) components are typically combined in printed circuit board-level products. The two component types cannot be directly interfaced, because the TTL components use a bipolar transistor process and the CMOS components use a field effect transistor process. At a minimum, different switching thresholds and input and output characteristics create well-known inherent incompatibilities between bipolar and field effect transistors. Therefore, in order for a systems designer to drive a CMOS chip with a TTL chip, the CMOS chip must be able to accept standard TTL level signals.

The standard maximum TTL output voltage level to guarantee a logic "zero" is 0.4 volts, and the standard minimum output voltage level to guarantee a logic "one" is 2.4 volts. But in order to provide some design margin and noise immunity, a circuit which receives a TTL output must be able to recognize a logic zero as a voltage less than or equal to 0.8 volts. Similarly, the receiving circuit must recognize a logic one as a voltage greater than or equal to 2.0 volts. (The noise margin in this case is 400 millivolts.)

CMOS components switch their individual logic element outputs between ground and the positive supply voltage, effectively switching from "rail" to "rail". When CMOS and TTL chips are to be mixed, an interface circuit must ordinarily be provided to translate the standard TTL output voltage levels to voltage levels that can be used by a CMOS chip. For example, in a system where the positive supply voltage is nominally five volts, an signal input of 2.0 volts, or more, must be translated to a five volt signal level. And an input of 0.8 volts, or less, must be translated to zero volts. The interface circuit which accomplishes this task is generally referred to as a TTL-to-CMOS input buffer.

TTL-to-CMOS input buffers must accept a TTL "AC" input of zero to three volts and convert it to a CMOS output of zero to five volts, as fast as possible. According to standard TTL input specifications, this same buffer is required to recognize a TTL "DC" input of greater than 2.0 volts as a logic one, and a "DC" input of less than 0.8 volts as a logic zero. The simplest way to construct such a buffer is to use a CMOS inverter 12, as shown in FIG. 1A, wherein an N-channel transistor 14 and a P-channel transistor 6 are sized appropriately.

In typical CMOS processes, the N-channel threshold voltage will be about 0.8 volts, and the P-channel threshold voltage will be about −1.1 volts. Since N-channel transistor gain is about twice that of P-channel transistor gain, per unit of area, it has been common to implement the input buffer of FIG. 1A by making the width-to-length ratio (W/L) of the N-channel transistors, such as transistor 14, about four times the W/L of the P-channel transistor, such as transistor 16, in order to produce a TTL-to-CMOS input buffer 12 with the desired electrical characteristics. These ratios are designed to make an inverter that actually switches when its input voltage is about 1.4 volts. (This voltage is typically labelled Vin.) The switching point is halfway between the standard TTL LOW (0.8 volts) and TTL HIGH (2.0 volts).

For inverter 12, when Vin is less than 0.8 volts, N-channel transistor 14 will be completely turned off, because its gate-to-source voltage (Vgs) is less than the N-channel transistor threshold voltage (Vtn). And P-channel transistor 16 will be turned on, because its Vgs will be less than −4.2 volts. With N channel transistor 14 turned off and P-channel transistor 16 turned on, the inverter output node is pulled substantially to Vcc (which is nominally at +5 volts). The DC current drawn from Vcc in this case will be very small (e.g. just leakage).

MOS transistor gain $\beta$, can be described as $$\beta = \frac{\epsilon_{ox} \mu W}{T_{ox} L} \; ;$$

so when, in FIG. 1A, Vin=2.0 volts, N-channel transistor 14 will be turned on, because it has a Vgs>Vtn. P-channel transistor 16 will also be turned on, because its Vgs=−3.0 volts. See FIG. 1B. However, N-channel transistor 14 has a lower effective on-resistance (Ron) than does P-channel transistor 16. This is generally due to, a) $\dfrac{W_{N\text{-}channel} \text{ transistor 14}}{L_{N\text{-}channel} \text{ transistor 14}}$ which is sized larger than $\dfrac{W_{P\text{-}channel} \text{ transistor 16}}{L_{P\text{-}channel} \text{ transistor 16}}$ , and b) N-channel transistor 14 having an inherently greater Carrier mobility $\mu$, thus making the gain of N-Channel transistor 14 greater than that of P-channel transistor 16.

The lower on-resistance of N-channel transistor 14 results in Vout being less than 0.8 volts, which is a logic zero. The problem with a logic one input of two volts is that neither P-channel transistor 16 nor N-channel transistor 14 are completely turned off, which allows a significant DC current to be drawn from Vcc. This current is a function of the actual transistor sizes, it can typically range from as little as 0.1 mA to over one milliamp.

For circuits with many TTL-to-CMOS input buffers, the cumulative standby current for TTL logic one inputs can be significant. Such a standby current can generate extra heat which must be dissipated, and creates an additional burden for the system cooling scheme (whether it be a fan or convection air flow). This standby current is obviously particularly undesirable if the system is powered by batteries. Another problem created by this standby current is faced not by the system designer, but by the chip designer. The physical size of the internal power buses of the chip must be made larger to accommodate this current, which wastes chip real estate.

There have been several circuits proposed which are more complex than the circuit of FIG. 1A aimed at reducing the above standby current for a TTL logic one input. However none totally reduce the DC current to just leakage. A TTL-to-CMOS input buffer is offered by Noufer, et al., in U.S. Pat. No. 4,471,242. His input buffer translates TTL levels into CMOS levels while eliminating the DC current path in prior art input buffers, such as shown in FIG. 1A. Noufer, et al., introduce a reference voltage to match the lowest level of a TTL logic one signal. The input inverter has a P-channel transistor which does not turn on when the TTL signal is at the lowest level of a logic one, by having a source at the reference voltage. This reference voltage is selected to be less than the lowest level of a logic one minus the threshold voltage of the P-channel transistor. However, Noufer, et al., do not teach the use of a CMOS NOR gate which provides feedback through a P-channel transistor to its cross-coupled inverters. Worse, the reference voltage generator draws current in Noufer, et al.

SUMMARY OF THE PRESENT INVENTION

It is therefore an object of the present invention to provide a TTL-to-CMOS input buffer that has very low standby supply current for both DC TTL-level logic LOW or HIGH inputs.

It is a further object of the present invention to provide a TTL-to-CMOS input buffer that has a high spurious input noise rejection level.

It is a further object of the present invention to provide low standby current consumption and noise rejection, without the use of a current consuming reference voltage circuit.

It is a further advantage to reduce the required chip-area-consuming power bus widths needed to support current wasting TTL-to-CMOS input buffers.

Briefly, the present invention is a low power, noise rejecting TTL-to-CMOS input buffer comprising a level shifting CMOS inverter, a four transistor CMOS reset-set (RS) flip-flop, a two input CMOS NOR gate, a second CMOS inverter for providing output drive, and a P-channel pull-up transistor. The RS flip-flop "set" input is connected to a TTL-level input, and the "reset" input is connected to an inverted version of the TTL input. All the transistors used have gate widths and lengths such that all paths between power and ground are turned off when the buffer input signal is at a DC level of less than 0.8 volts or greater than 2.0 volts. The input buffer characteristics dynamically adapt to a rapidly changing input signal such that its switching point moves up to reject high-frequency high-amplitude noise.

An advantage of the present invention is that very low standby currents result for DC TTL-level logic LOW or HIGH inputs.

A further advantage of the present invention is that input noise rejection is improved.

A further advantage of the present invention is that current consuming reference voltage circuits found in prior art TTL-to-CMOS input buffers are eliminated.

A further advantage of the present invention is that an area savings is realized on a chip with many TTL compatible inputs.

These and many other objects and advantages of the present invention will no doubt become obvious to those of ordinary skill in the art after having read the following detailed description of the preferred embodiments which are illustrated in the various drawing figures.

IN THE DRAWINGS

FIG. 1A is a schematic diagram of a prior art TTL-to-CMOS input buffer;

FIG. 1B is a DC transfer curve showing the relationship between DC input and output voltages of the circuit shown in FIG. 1A;

FIG. 2 is a schematic diagram of a first embodiment of the present invention;

DETAILED DESCRIPTION OF THE PREFERRED EMBODIMENTS

Figure 3:
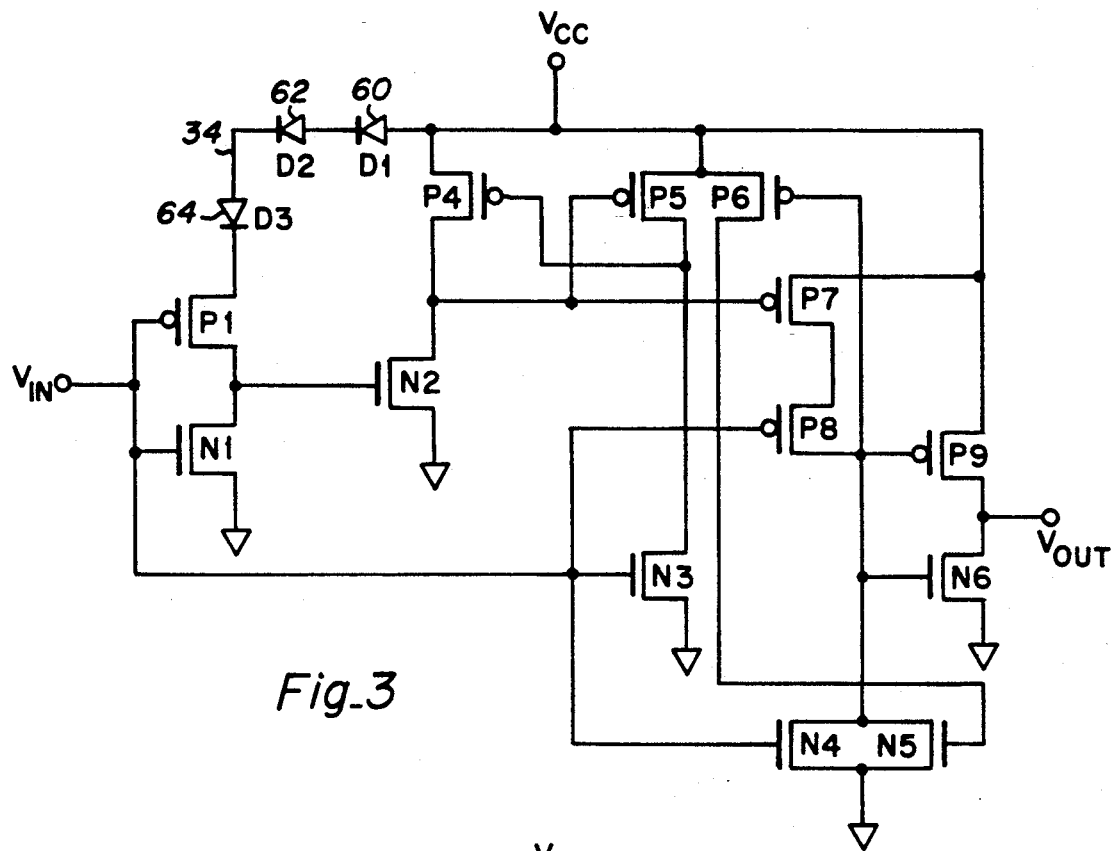
FIG. 3 is a schematic diagram of a second embodiment of the present invention.

A first embodiment of the present invention is a buffer 20, shown in FIG. 2, and comprises several NMOS and PMOS transistors 21–35, listed by reference number and schematic label in Table I, below. Assume for a moment that the NMOS transistors have a threshold voltage of $Vtn = +0.8$ volts, and the PMOS transistors have a threshold voltage of $Vtp = -1.1$ volts. Table I lists the transistor sizes for a typical modern submicron CMOS process for the devices used.

TABLE I

| Reference Numeral | Transistor | Drawn Width (in microns) | Drawn Length (in microns) |
|---|---|---|---|
| 21 | N1 | 3 | 1 |
| 22 | N2 | 10 | 1 |
| 23 | N3 | 10 | 1 |
| 24 | N4 | 10 | 1 |
| 25 | N5 | 10 | 1 |
| 26 | N6 | 20 | 1 |
| 27 | P1 | 6 | 1 |
| 28 | P2 | 40 | 1 |
| 29 | P3 | 40 | 1 |
| 30 | P4 | 1 | 20 |
| 31 | P5 | 1 | 20 |
| 32 | P6 | 1 | 1 |
| 33 | P7 | 30 | 1 |
| 34 | P8 | 30 | 1 |
| 35 | P9 | 20 | 1 |

All of the transistors in the exemplary circuit of FIG. 2 have a drawn gate length of one micron, except for P-channel transistors 30 and 31. Due to lateral diffusion effects during fabrication, a drawn gate length of one micron will result in an effective gate length of about 0.7 micron for a finished chip. All the N-channel and P-channel transistors of FIG. 2 are shown using standard three-terminal MOSFET drawing symbols (each has a gate, a drain and a source terminal). However, it is well known to those of ordinary skill in this field that in a bulk CMOS process N-channel transistors will be formed in P-type substrates and P-channel transistors will be formed in N-type substrates. Preferably, the P-type N-channel transistor substrates are tied to ground and the N-type P-channel transistor substrates are tied to Vcc. If a selected CMOS process is an N-well process, then slightly faster performance can be achieved if P-channel transistor 27 and P-channel transistor 28 have individual N-wells (not shown), and further have their sources (nodes 40 and 42) connected to their respective substrates.

N-channel transistor 21, P-channel transistor 27, P-channel transistor 28, and P-channel transistor 29 make up a special type of inverter that has only leakage current for 2.0 volts<Vin<0.8 volts. This results from P-channel transistor 28 and P-channel transistor 29 being connected to act as simple level shifters to drop the nominal Vcc of 5.0 volts down two Vtp's to approximately 2.8 volts (5−1.1−1.1=2.8) at node 40. Node 40 is the source of P-channel transistor 27. So, when Vin is greater than 2.0 volts, P-channel transistor 27 will have a gate-to-source voltage (Vgs) greater than −0.8 volts, which is greater than −1.1 volts, turning off P-channel transistor 27. When Vin is less than 0.8 volts, N-channel transistor 21 will turn off. The output of this inverter, node 44, will swing from about 2.8 volts to ground when Vin swings from less than 0.8 volts to greater than 2.0 volts. Even though P-channel transistor 27 and N-channel transistor 21 get very little gate drive for a 0.8 to 2.0 volt Vin swing, node 44 still switches in less than one nanosecond, because it only has to drive the small capacitance of the gate of N-channel transistor 22. The TTL-level input signal may be passed through an input protection network prior to being received by the input buffer of the present invention. A pair of cross-coupled inverters 46 and 48 can be viewed as an RS Flip-Flop with the "set" and "reset" inputs labelled as Vin and node 44 respectively. The TRUE output is a node 50. N-channel transistors 22 and 23 are sized to have much more gain than P-channel transistors 30 and 31. In fact, P-channel transistors 30 and 31 are intentionally sized very long and narrow, so that the signal rise times of nodes 50 and 52 will be relatively slow.

Transistors 24 and 25 and transistors 33 and 34 make up a two-input NOR gate 54 having its inputs supplied by nodes Vin and 50, as shown in FIG. 2. The transistor sizes in NOR gate 54 are adjusted so that its output node 56 switches when Vin is at about 2.5 volts and node 50 is at ground (zero volts). P-channel transistor 32 pulls node 50 quickly and completely to Vcc, once node 56 starts to go low, thus making for a shorter fall time for node 56. P-channel transistor 35 and N-channel transistor 26 are simply a buffering inverter for driving capacitive loads.

A second embodiment of the present invention is shown in FIG. 3. The voltage dropping function of transistors 28 and 29 (FIG. 2) can be accomplished by other means. In FIG. 3, the forward voltage drop of a set of three diodes 60, 62, and 64, in series, is used for the voltage dropping function.

Figure 4:
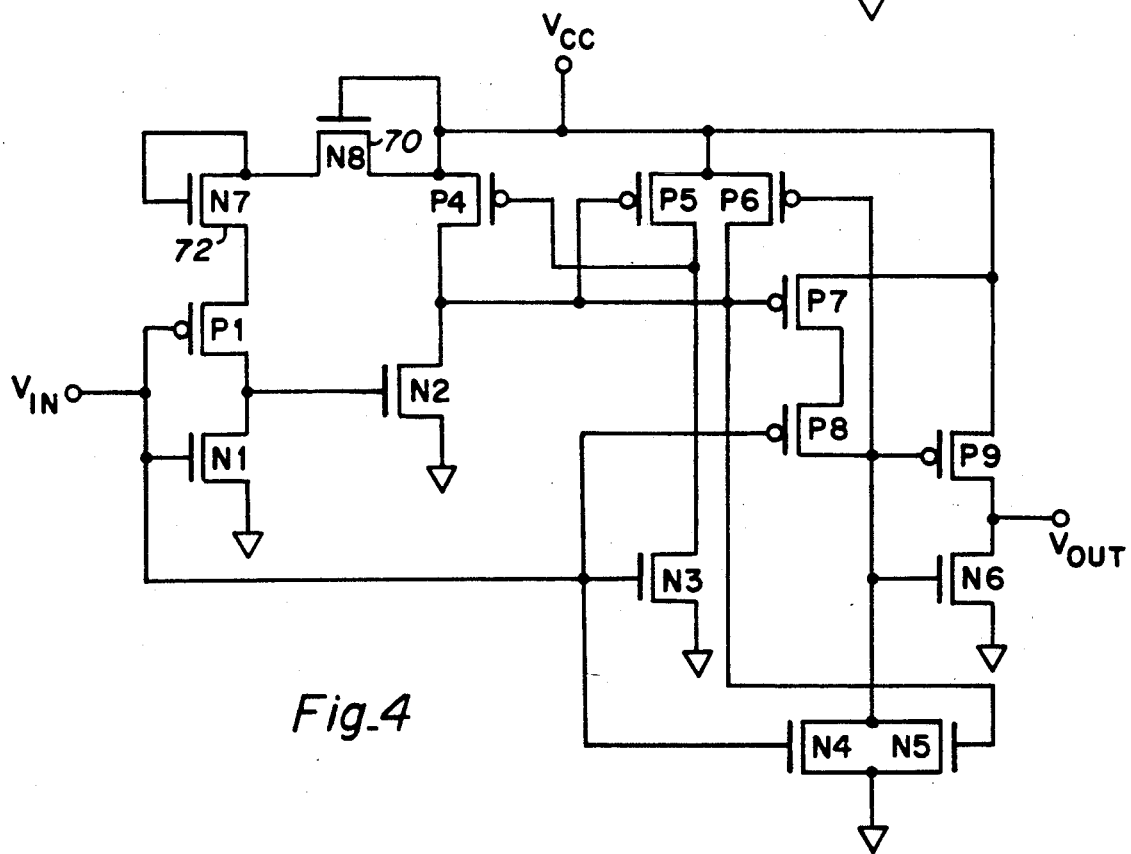
FIG. 4 is a schematic diagram of a third embodiment of the present invention.

FIG. 4 shows a third embodiment of the present invention wherein the voltage dropping function of transistors 28 and 29 is accomplished by a pair of N-channel transistors 70 and 72 which have their gates connected to their respective drains.

Figure 5:
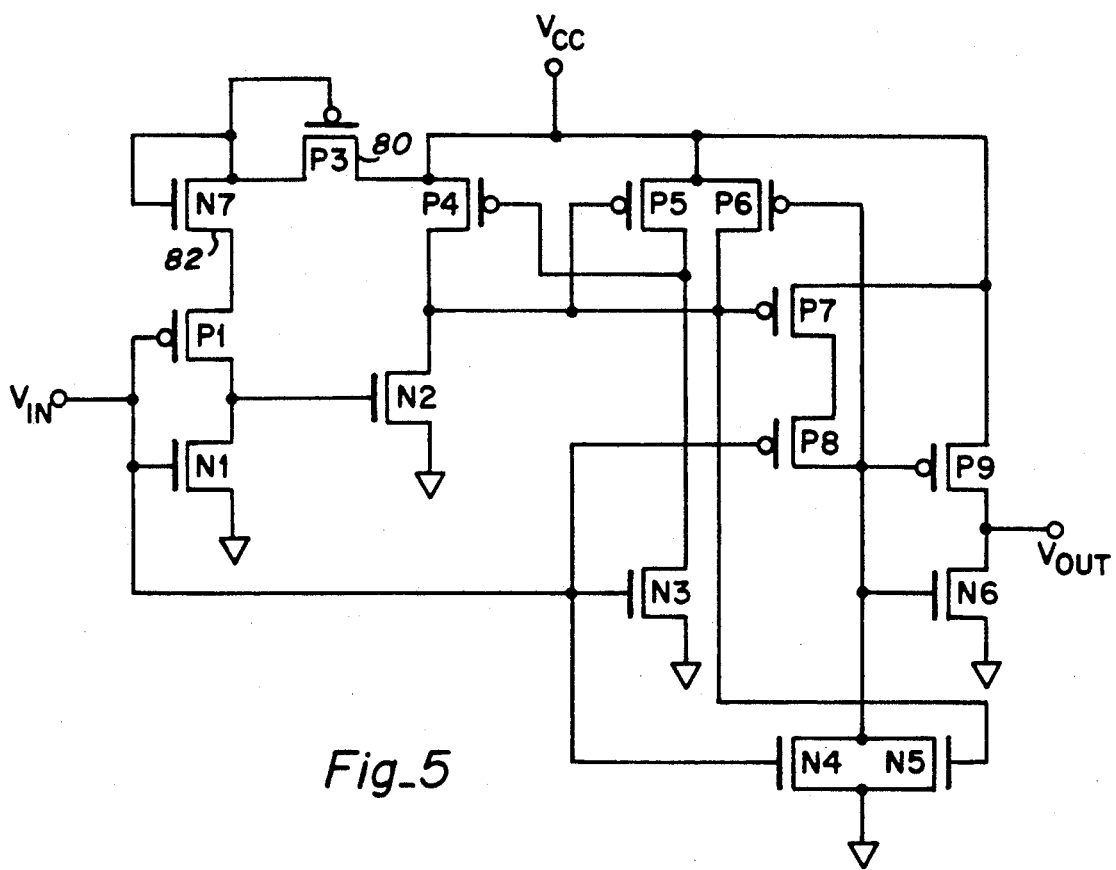
FIG. 5 is a schematic diagram of a fourth embodiment of the present invention.

FIG. 5 shows a fourth embodiment of the present invention wherein the voltage dropping function of transistors 28 and 29 is accomplished by a P-channel transistor 80 in series with an N-channel transistor 82, effectively replacing P-channel transistor 28 with N-channel transistor 82.

In a fifth embodiment of the present invention, the voltage dropping function may be achieved by an N-channel transistor with its gate and drain tied to a positive voltage supply and its source connected to the drain of a P-channel transistor. This P-channel transistor would have its gate and drain tied together.

Dynamic Description

Figure 6:
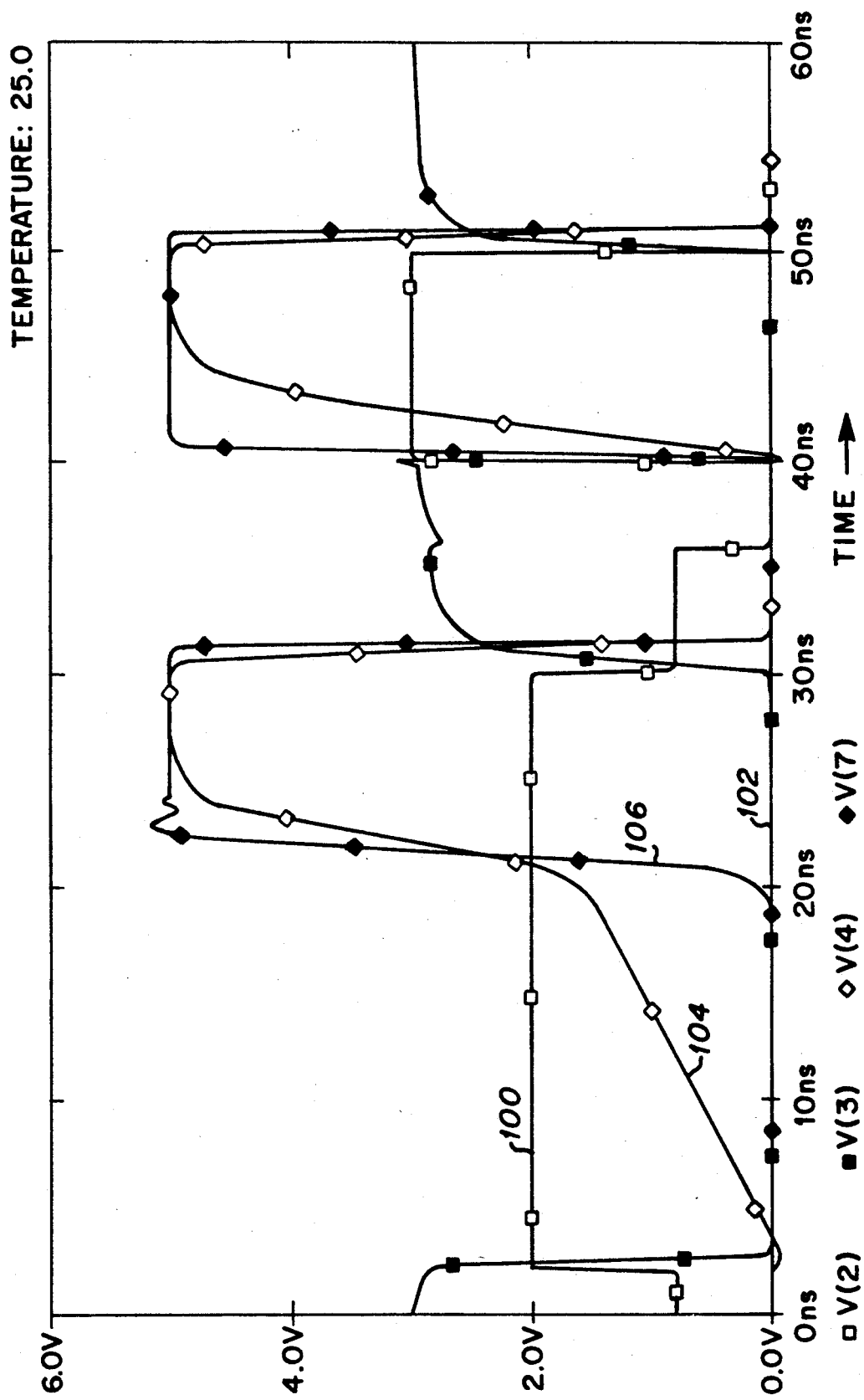
FIG. 6 is a circuit simulation output showing the expected waveforms generated by the circuit shown in FIG. 2.

Referring now to FIG. 6, a set of simulated waveforms of the circuit of FIG. 2 in operation is presented. A signal voltage input (Vin) waveform 100 is used as an input to a simulation. It swings between 0.8 volts and 2.0 volts to simulate a standard DC TTL signal condition. The Vin waveform 100 is driven between zero and 3.0 volts to simulate AC conditions. A waveform 102 represents the time-varying voltage at node 44 (FIG. 2), a waveform 104 represents the time-varying voltage at node 50 (FIG. 2), and a waveform 106 represents the time-varying voltage at node 58 (FIG. 2).

In FIG. 6 it can be seen that initializing Vin at 0.8 volts will result in the voltage at node 44 being approximately 2.8 volts, the voltage at node 50 being zero, the voltage at nodes 52 and 56 being approximately equal to Vcc, and the voltage at node 58 being zero. As shown, a rapid rise of Vin to 2.0 volts causes a rapid fall of the voltage at node 44 to zero volts and a rapid fall of the voltage at node 52 to zero volts. Node 52 being at zero volts will turn on P-channel transistor 30, causing node 44 to rise slowly. The output of NOR gate 54 will not immediately go low, because its transistors should be sized such that if only one input, Vin, is at 2.0 volts and the other input is at zero volts, it will not switch. However, after approximately twenty nanoseconds, when node 50 rises, node 56 will start to go low. When node 56 begins to fall, P-channel transistor 32 will turn on, to accelerate the rising of node 50 to Vcc. This enables rapid switching of nodes 56 and 58, once they start moving. From this portion of the simulation, it can be concluded that positive going Vin noise pulses of less than approximately 2.0 volts and less than approximately twenty nanoseconds will not be passed to the output of the buffer. It can further be seen that a DC Vin of approximately 2.0 volts, or greater, will switch the output of the buffer. Next, Vin falls from 2.0 volts to 0.8 volts. This change to the buffer input signal causes node 44 to rise to about 2.8 volts. The exact switching voltage of Vin that causes node 44 to rise will be determined by the respective sizes of N-channel transistor 21 and P-channel transistor 27. It is typically set to 1.4 volts. When node 44 reaches 2.8 volts, node 50 will be forced low, even though P-channel transistor 32 is on, because N-channel transistor 22 is sized 10 times larger than P-channel transistor 32. With node 50 and Vin being low, N-channel transistor 24 and N-channel transistor 25 are turned off, and P-channel transistor 33 and P-channel transistor 34 are turned on, which makes node 56 rise rapidly, and node 58 fall rapidly. P-channel transistor 32 is turned off after node 56 rises to Vcc.

Next, as shown in FIG. 6, Vin falls from 0.8 volts to zero volts in preparation for simulation of the rise of the buffer input signal from zero volts to 3.0 volts for the AC portion of the simulation. This rise to 3.0 volts of Vin causes nodes 44 and 52 to almost immediately drop to zero volts. Node 50 will start to slowly rise. However, three volts is a high enough level on one input of NOR gate 54 for output node 56 to almost immediately begin falling, without waiting for node 50 to rise. When node 56 goes low, P-channel transistor 32 is again turned on and almost immediately pulls node 50 to Vcc. The exact Vin required to switch node 56 low is determined by the sizes of N-channel transistor 24, N-channel transistor 25, P-channel transistor 33, and P-channel transistor 34. A typical switching point being Vin at approximately 2.5 volts. For a Vin fall from 3.0 volts to zero volts, node 56 does not switch high for the same Vin that caused it to switch low, because now node 50 is at Vcc. Node 56 will not switch low again until Vin falls low enough to cause node 44 to rise and node 50 to fall. Node 44 will start rising when Vin falls to less than 1.4 volts, just as in the above-described DC portion of the simulation.

Standby Power

If the N-channel threshold voltage is approximately 0.8 volts and the P-channel threshold voltage is −1.1 volts, then the input buffer circuit of FIG. 2 will draw only an insignificant leakage current from Vcc for 2.0 < Vin < 0.8 volts.

This results for the case of Vin < 0.8 volts because N-channel transistor 21 and N10 channel transistor 23 are turned off. P-channel transistor 27 is turned on, making the voltage at node 44 equal to ..28 volts, which turns on N-channel transistor 22, and forces node 50 low. This turns on P-channel transistor 31, which turns off P-channel transistor 30. With Vin and node 44 low, P-channel transistor 33 and P-channel transistor 34 will be on, and N-channel transistors 24 and 25 will be off, pulling node 56 to Vcc and turning off P-channel transistor 32. With node 56 at Vcc, N-channel transistor 29 will be on, and P-channel transistor 35 will be off, and node 58 will be at ground. Therefore, there will be no conducting paths from Vcc to ground because:

- N-channel transistor 21 is off in the path of P-channel transistor 29, P-channel transistor 28, P-channel transistor 27, N-channel transistor 21;
- P-channel transistor 30 and P-channel transistor 32 are off in the path of P-channel transistor 30, P-channel transistor 32, N-channel transistor 22;
- N-channel transistor 23 is off in the path of P-channel transistor 31, N-channel transistor 23;
- N-channel transistor 24 and N-channel transistor 25 are off in the path P-channel transistor 33, P-channel transistor 34, N-channel transistor 24, N-channel transistor 25; and
- P-channel transistor 38 is off in the path of P-channel transistor 38, N-channel transistor 26.

A leakage-current-only result is achieved for the case of Vin > 2.0 volts because P-channel transistor 22 is off when its source is 2.8 volts and its gate is greater than 2.0 volts. N-channel transistor 21 is on, which makes node 44 low, which turns off N-channel transistor 22. N-channel transistor 23 is on, pulling node 52 low, which turns on P-channel transistor 30, which pulls node 50 to Vcc, because N-channel transistor 22 is off. With Vin high and node 50 at Vcc, N-channel transistor 24 and N-channel transistor 25 are on. P-channel transistor 33 is off, and P-channel transistor 34 is partially on, because its gate is greater than 2.0 volts but not at Vcc. Since P-channel transistor 33 is completely off and N-channel transistors 24 and 25 are on, node 56 will be at ground which turns on P-channel transistor 32, and which further causes node 58 to be at Vcc, with P-channel transistor 35 on and N-channel transistor 26 off.

There will be no conducting paths from Vcc to ground, because:

- P-channel transistor 27 is off in the DC path of P-channel transistor 29, P-channel transistor 28, P-channel transistor 27, N-channel transistor 21;
- N-channel transistor 22 is off in the DC path of P-channel transistor 24, P-channel transistor 32, and N-channel transistor 22;
- P-channel transistor 31 is off in the DC path of P-channel transistor 31 and N-channel transistor 23;
- P-channel transistor 33 is off in the path of P-channel transistor 33, P-channel transistor 34, N-channel transistor 24, N-channel transistor 25; and
- N-channel transistor 26 is off in the DC path of P-channel transistor 35 and N-channel transistor 26.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the present invention.

What is claimed is:

1. A noise rejecting, low power, TTL-to-CMOS logic level translator, comprising in combination:
   - a pair of power supply terminals, one of said pair being a positive voltage terminal and the other of said pair being an electrical ground;
   - an input means;
   - a means for reducing a positive power supply voltage having an input connected to said positive voltage terminal and an output;
   - a first inverter circuit having a first power supply terminal connected to said reducing means output, a second power supply terminal connected to said electrical ground, an input coupled to said input means, and an output;
   - a CMOS set-reset flip-flop having a set input coupled to said input means, a reset input coupled to said first inverter and a true output; and
   - a two input NOR gate having one input coupled to said input means, a second input coupled to said flip-flop true output, and an output for communicating level-translated TTL input signals.

2. The translator of claim 1, further comprising:
   - a second inverter electrically connected to said positive voltage terminal and said electrical ground, having an input and an output, wherein said second inverter input is coupled to the output of said two input NOR gate.

3. The translator of claim 2, wherein:
   - said second inverter comprises a P-channel transistor and an N-channel transistor electrically connected in series, said P-channel and said N-channel transistors having the same drawn width and length.

4. The translator of claim 1, wherein:
   - said input means includes an input protection circuit.

5. The translator of claim 1, wherein:
   - said means for reducing a positive supply voltage comprises a plurality of P-channel transistors.

6. The translator of claim 1, wherein:
   - said means for reducing a positive supply voltage comprises a first P-channel transistor having its source electrically connected to said positive voltage terminal, and its gate and drain electrically connected to each other, and a second P-channel transistor having its source electrically connected to said first P-channel transistor drain, and its gate and drain electrically connected to each other.

7. The translator of claim 1, wherein:
said means for reducing a positive supply voltage comprises a first diode having its anode electrically connected to said positive voltage terminal, a second diode having its anode electrically connected the cathode of said first diode, and a third diode having its anode electrically connected to the cathode of said second diode.

8. The translator of claim 1, wherein:
said means for reducing a positive supply voltage comprises a first N-channel transistor having its gate and drain both electrically connected to said positive voltage terminal, and a second N-channel transistor having its gate and drain electrically connected to the source of said first N-channel transistor.

9. The translator of claim 1, wherein:
said means for reducing a positive supply voltage comprises a P-channel transistor having its source electrically connected to said positive voltage terminal, and its gate and drain connected to each other, and an N-channel transistor having its gate and drain electrically connected the gate and drain of said P-channel transistor.

10. The translator of claim 1 wherein said means for reducing a positive supply voltage comprises an N-channel transistor having its gate and drain both electrically connected to said positive voltage terminal, and a P-channel transistor having its source electrically connected to the source of said N-channel transistor, and its gate and drain connected to each other.

11. The translator of claim 1, wherein said CMOS set-reset flip-flop comprises:
a first P-channel transistor having its source connected to said positive voltage supply terminal;
a first N-channel transistor having its drain connected to the drain of said first P-channel transistor, its source connected to said electrical ground, and its gate connected as said reset input;
a second P-channel transistor having its source connected to said positive voltage supply terminal, and its gate connected to the drain of said first P-channel transistor; and
a second N-channel transistor having its drain connected to the drain of said second P-channel transistor, its source connected to said electrical ground and its gate connected as said set input.

12. The translator of claim 5, wherein:
said P-channel transistors are each formed in an individual N-well, and each said P-channel transistor has its respective source connected to its respective N-well.

13. The translator of claim 1, wherein:
said first inverter comprises a P-channel transistor and an N-channel transistor connected in series wherein said P-channel transistor W/L ratio is approximately twice that of said N-channel transistor W/L ratio 14. A TTL-to-CMOS input buffer comprising:
an input line;
a voltage dropping circuit having an input coupled to a positive voltage supply, and an output;
a first CMOS inverter comprising a P-channel transistor and an N-channel transistor in series, connected between said voltage dropping circuit output and a ground terminal, having an input coupled to said input line, and an output, wherein:
said P-channel transistor W/L ratio is approximately twice said N-channel transistor W/L ratio;
a CMOS Set-Reset flip-flop having a set input coupled to said input line, a reset input coupled to said CMOS inverter output, and a true output;
a P-channel accelerating pull-up transistor connected between said positive voltage supply and said flip-flop true output;
a fully static CMOS two input NOR gate having a first input coupled to said input line, a second input coupled to said flip-flop true output, and an output; and
a second CMOS inverter comprising a P-channel transistor and an N-channel transistor in series, having an input coupled to said NOR gate output, and an output for supplying CMOS level signals, wherein:
said P-channel and N-channel transistors have substantially the same W/L ratio.

15. The buffer of claim 14, wherein:
the CMOS Set-Reset flip-flop has relatively fast fall times and relatively slow rise times for its outputs.

* * * * *